(12) United States Patent
Catalano et al.

(10) Patent No.: US 9,049,768 B2
(45) Date of Patent: *Jun. 2, 2015

(54) LIGHT EMITTING DIODE REPLACEMENT LAMP

(71) Applicants: Anthony Catalano, Boulder, CO (US); Daniel Harrison, Nederland, CO (US); John J. Hall, Boulder, CO (US)

(72) Inventors: Anthony Catalano, Boulder, CO (US); Daniel Harrison, Nederland, CO (US); John J. Hall, Boulder, CO (US)

(73) Assignee: TerraLUX, Inc., Longmont, CO (US)

( * ) Notice: Subject to any disclaimer, the term of this patent is extended or adjusted under 35 U.S.C. 154(b) by 1 day.

This patent is subject to a terminal disclaimer.

(21) Appl. No.: 14/184,071

(22) Filed: Feb. 19, 2014

(65) Prior Publication Data

US 2014/0217926 A1 Aug. 7, 2014

Related U.S. Application Data

(60) Continuation of application No. 13/766,196, filed on Feb. 13, 2013, which is a continuation of application No. 12/834,234, filed on Jul. 12, 2010, now Pat. No. 8,400,081, which is a continuation of application No. 11/928,752, filed on Oct. 30, 2007, now Pat. No.

(Continued)

(51) Int. Cl.

| H05B 41/16 | (2006.01) |
|---|---|
| H05B 33/08 | (2006.01) |
| F21K 99/00 | (2010.01) |
| F21V 23/00 | (2006.01) |
| F21Y 101/02 | (2006.01) |

(52) U.S. Cl.

CPC ......... *H05B 33/0884* (2013.01); *F21Y 2101/02* (2013.01); *H05B 33/0803* (2013.01); *H05B 33/0818* (2013.01); *H05B 33/0821* (2013.01); *H05B 33/0854* (2013.01); *Y02B 20/347* (2013.01); *Y02B 20/383* (2013.01); *F21K 9/137* (2013.01); *F21V 23/003* (2013.01)

(58) Field of Classification Search
USPC .............. 315/291, 307–326, 247, 185 A, 224
See application file for complete search history.

(56) References Cited

U.S. PATENT DOCUMENTS

| 3,795,830 A | 3/1974 | Richardson |
| 4,211,955 A | 7/1980 | Ray |
| 4,214,295 A | 7/1980 | Morton |
| 4,727,289 A | 2/1988 | Uchida |
| 4,783,726 A | 11/1988 | Wang |
| 4,999,750 A | 3/1991 | Gammache |

(Continued)

FOREIGN PATENT DOCUMENTS

| CN | 103502729 A | 1/2014 |
| EP | 1081771 A2 | 3/2001 |

(Continued)

OTHER PUBLICATIONS

International Patent Application No. PCT/US2012/028990, International Search Report and Written Opinion mailed Sep. 6, 2012, 7 pages.

International Patent Application No. PCT/US2012/028990, International Preliminary Report on Patentability mailed Nov. 7, 2013, 6 pages.

(Continued)

*Primary Examiner* — Tuyet Vo

(74) *Attorney, Agent, or Firm* — Morgan, Lewis & Bockius LLP

(57) ABSTRACT

Thermal management and control techniques for light emitting diode and other incandescent replacement light technologies using a current controller are disclosed.

24 Claims, 13 Drawing Sheets

Related U.S. Application Data 7,777,430, which is a continuation-in-part of application No. 10/820,930, filed on Apr. 8, 2004, now Pat. No. 7,318,661, said application No. 11/928,752 is a continuation-in-part of application No. 10/893,727, filed on Jul. 16, 2004, now Pat. No. 7,296,913, said application No. 11/928,752 is a continuation-in-part of application No. 11/868,406, filed on Oct. 5, 2007, now Pat. No. 7,597,456, which is a division of application No. 10/893,727, filed on Jul. 16, 2004, now Pat. No. 7,296,913.

(60) Provisional application No. 60/502,495, filed on Sep. 12, 2003, provisional application No. 60/517,130, filed on Nov. 4, 2003.

(56) References Cited

U.S. PATENT DOCUMENTS

| | | |
|---|---|---|
| 5,097,180 A | 3/1992 | Ignon et al. |
| 5,189,339 A | 2/1993 | Peshak |
| 5,222,800 A | 6/1993 | Chan et al. |
| 5,463,280 A | 10/1995 | Johnson |
| 5,465,197 A | 11/1995 | Chien |
| 5,473,525 A | 12/1995 | Stout |
| 5,506,760 A | 4/1996 | Giebler et al. |
| 5,555,161 A | 9/1996 | Roe et al. |
| 5,561,346 A | 10/1996 | Byrne |
| 5,575,459 A | 11/1996 | Anderson |
| 5,632,551 A | 5/1997 | Roney et al. |
| 5,655,830 A | 8/1997 | Ruskouski |
| 5,663,719 A | 9/1997 | Deese et al. |
| 5,749,646 A | 5/1998 | Brittell |
| 5,806,973 A | 9/1998 | Porter |
| 5,850,126 A | 12/1998 | Kanbar |
| 5,935,599 A | 8/1999 | Dadey |
| 5,936,599 A | 8/1999 | Reymond |
| 5,994,845 A | 11/1999 | Gibboney, Jr. |
| 6,019,493 A | 2/2000 | Kuo et al. |
| 6,091,614 A | 7/2000 | Malenfant |
| 6,111,739 A | 8/2000 | Wu et al. |
| 6,140,776 A | 10/2000 | Rachwal |
| 6,150,771 A | 11/2000 | Perry |
| 6,161,910 A | 12/2000 | Reisenauer et al. |
| 6,184,628 B1 | 2/2001 | Ruthenberg |
| 6,190,020 B1 | 2/2001 | Hartley |
| 6,218,785 B1 | 4/2001 | Incerti |
| 6,220,722 B1 | 4/2001 | Begemann |
| 6,232,784 B1 | 5/2001 | Dulasky |
| 6,234,645 B1 | 5/2001 | Börner et al. |
| 6,234,648 B1 | 5/2001 | Borner et al. |
| 6,242,870 B1 | 6/2001 | Koyanagi et al. |
| 6,285,139 B1 | 9/2001 | Ghanem |
| 6,310,445 B1 | 10/2001 | Kashaninejad |
| 6,313,589 B1 | 11/2001 | Kobayashi et al. |
| 6,357,889 B1 | 3/2002 | Duggal et al. |
| 6,371,636 B1 | 4/2002 | Wesson |
| 6,380,865 B1 | 4/2002 | Pederson |
| 6,485,160 B1 | 11/2002 | Sommers et al. |
| 6,528,954 B1 | 3/2003 | Lys et al. |
| 6,570,505 B1 | 5/2003 | Malenfant |
| 6,580,228 B1 | 6/2003 | Chen et al. |
| 6,595,671 B2 | 7/2003 | Lefebvre et al. |
| 6,626,557 B1 | 9/2003 | Taylor |
| 6,634,771 B2 | 10/2003 | Cao |
| 6,644,841 B2 | 11/2003 | Martineau |
| 6,727,652 B2 | 4/2004 | Sivacumarran |
| 6,733,152 B2 | 5/2004 | Maglica |
| 6,791,283 B2 | 9/2004 | Bowman et al. |
| 6,793,374 B2 | 9/2004 | Begemann |
| 6,819,056 B2 | 11/2004 | Lin |
| 6,853,151 B2 | 2/2005 | Leong et al. |
| 6,871,983 B2 | 3/2005 | Jacob et al. |
| 6,880,951 B2 | 4/2005 | Yoon |
| 6,893,140 B2 | 5/2005 | Storey et al. |
| 6,924,605 B2 | 8/2005 | Chun |
| 6,924,606 B2 | 8/2005 | Yu et al. |
| 6,948,829 B2 | 9/2005 | Verdes et al. |
| 6,957,897 B1 | 10/2005 | Nelson et al. |
| 6,981,784 B2 | 1/2006 | Dubuc |
| 7,008,084 B2 | 3/2006 | Galli |
| 7,015,650 B2 | 3/2006 | McGrath |
| 7,118,249 B2 | 10/2006 | Hsu et al. |
| 7,160,012 B2 | 1/2007 | Hilscher et al. |
| 7,204,602 B2 | 4/2007 | Archer |
| RE39,856 E | 9/2007 | Ruthenberg |
| 7,296,913 B2 | 11/2007 | Catalano et al. |
| 7,300,173 B2 | 11/2007 | Catalano et al. |
| 7,318,661 B2 | 1/2008 | Catalano |
| 7,448,770 B2 | 11/2008 | Catalano et al. |
| 7,597,456 B2 | 10/2009 | Catalano et al. |
| 7,604,378 B2 | 10/2009 | Wolf et al. |
| 7,699,494 B2 | 4/2010 | Catalano et al. |
| 7,852,015 B1 | 12/2010 | Yen et al. |
| 7,946,730 B2 | 5/2011 | Catalano et al. |
| 8,033,682 B2 | 10/2011 | Catalano et al. |
| 8,222,801 B2 | 7/2012 | Wang et al. |
| 8,240,873 B2 | 8/2012 | Catalano et al. |
| 8,297,796 B2 | 10/2012 | Catalano |
| 8,328,385 B2 | 12/2012 | Catalano et al. |
| 8,328,386 B2 | 12/2012 | Catalano et al. |
| 8,400,081 B2 | 3/2013 | Catalano et al. |
| 8,632,215 B2 | 1/2014 | Catalano et al. |
| 8,702,275 B2 | 4/2014 | Catalano et al. |
| 8,746,930 B2 | 6/2014 | Catalano et al. |
| 8,823,290 B2 | 9/2014 | Catalano et al. |
| 2001/0014019 A1 | 8/2001 | Begemann |
| 2002/0030455 A1 | 3/2002 | Ghanem |
| 2002/0130786 A1 | 9/2002 | Weindorf |
| 2002/0141196 A1 | 10/2002 | Camarota et al. |
| 2002/0176250 A1 | 11/2002 | Bohler et al. |
| 2003/0039122 A1 | 2/2003 | Cao |
| 2003/0067787 A1 | 4/2003 | Serizawa |
| 2003/0103348 A1 | 6/2003 | Hung |
| 2003/0112627 A1 | 6/2003 | Deese |
| 2003/0179548 A1 | 9/2003 | Becker et al. |
| 2003/0210552 A1 | 11/2003 | Barlian et al. |
| 2004/0028099 A1 | 2/2004 | Hongo et al. |
| 2004/0070990 A1 | 4/2004 | Szypszak |
| 2004/0189262 A1 | 9/2004 | McGrath |
| 2004/0190286 A1 | 9/2004 | Chapman |
| 2005/0052865 A1 | 3/2005 | Siktberg et al. |
| 2005/0057187 A1 | 3/2005 | Catalano |
| 2005/0225985 A1 | 10/2005 | Catalano et al. |
| 2005/0231948 A1 | 10/2005 | Pohlert et al. |
| 2006/0012997 A1 | 1/2006 | Catalano et al. |
| 2006/0250270 A1 | 11/2006 | Tangen |
| 2007/0019415 A1 | 1/2007 | Leblanc et al. |
| 2008/0019123 A1 | 1/2008 | Catalano et al. |
| 2008/0024070 A1 | 1/2008 | Catalano et al. |
| 2008/0099770 A1 | 5/2008 | Mendendorp et al. |
| 2008/0130288 A1 | 6/2008 | Catalano et al. |
| 2009/0034262 A1 | 2/2009 | Catalano et al. |
| 2009/0309501 A1 | 12/2009 | Catalano et al. |
| 2010/0027085 A1 | 2/2010 | Catalano |
| 2010/0117560 A1 | 5/2010 | Cao |
| 2010/0165611 A1 | 7/2010 | Catalano et al. |
| 2010/0320499 A1 | 12/2010 | Catalano et al. |
| 2011/0019417 A1 | 1/2011 | Van Laanen et al. |
| 2011/0260647 A1 | 10/2011 | Catalano et al. |
| 2012/0044673 A1 | 2/2012 | Catalano et al. |
| 2012/0044674 A1 | 2/2012 | Catalano et al. |
| 2012/0051035 A1 | 3/2012 | Catalano et al. |
| 2012/0120649 A1 | 5/2012 | Catalano et al. |
| 2012/0134150 A1 | 5/2012 | Catalano et al. |
| 2014/0036488 A1 | 2/2014 | Catalano et al. |
| 2014/0036489 A1 | 2/2014 | Catalano et al. |
| 2014/0168986 A1 | 6/2014 | Catalano et al. |
| 2014/0218914 A1 | 8/2014 | Catalano et al. |

FOREIGN PATENT DOCUMENTS

| | | |
|---|---|---|
| JP | 2004-119287 A | 4/2004 |
| JP | 2004146205 A | 5/2004 |

(56) References Cited

FOREIGN PATENT DOCUMENTS

| | | |
|---|---|---|
| JP | 2007-234386 A | 9/2007 |
| JP | 2011-14505 A | 1/2011 |
| JP | 2012-99297 A | 5/2012 |
| JP | 2014-516466 A | 7/2014 |
| WO | 2010/084546 A1 | 7/2010 |

OTHER PUBLICATIONS

Examination Report Received for Australian Patent Application No. 2012250206, mailed on May 21, 2014, 2 pages.

Examination Report Received for Japanese Patent Application No. 2014-508352, mailed on Aug. 19, 2014, 12 pages (7 pages of English Translation).

LIGHT EMITTING DIODE REPLACEMENT LAMP

CROSS-REFERENCE TO RELATED APPLICATIONS

This application is a continuation of U.S. patent application Ser. No. 13/766,196, filed Feb. 13, 2013, which is a continuation of U.S. patent application Ser. No. 12/834,234, filed Jul. 12, 2010, now issued as U.S. Pat. No. 8,400,081, which is a continuation of U.S. patent application Ser. No. 11/928,752, filed Oct. 30, 2007, now issued as U.S. Pat. No. 7,777,430, which is (A) a continuation-in-part of U.S. patent application Ser. No. 10/820,930, filed Apr. 8, 2004, now issued as U.S. Pat. No. 7,318,661, which claims priority to U.S. Provisional Patent Application 60/502,495, filed Sep. 12, 2003, (B) a continuation-in-part of U.S. patent application Ser. No. 10/893,727, filed Jul. 16, 2004, now issued as U.S. Pat. No. 7,296,913, which claims priority to U.S. Provisional Patent Application 60/517,130, filed Nov. 4, 2003, and (C) a continuation-in-part of U.S. patent application Ser. No. 11/868,406, filed Oct. 5, 2007, now issued as U.S. Pat. No. 7,296,913, which is a division of U.S. patent application Ser. No. 10/893,727, filed Jul. 16, 2004, now issued as U.S. Pat. No. 7,296,913, which claims priority to U.S. Provisional Patent Application 60/517,130, filed Nov. 4, 2003. The entire disclosure of each of these applications is hereby incorporated by reference herein.

BACKGROUND

1. Field of the Invention

The present invention relates to a light emitting diode (LED) illumination device and method and more specifically to a light emitting diode, integrated with electronic circuitry.

2. Description of Related Art

Currently lighting applications are dominated by incandescent lighting products. Because they use hot filaments, these products produce considerable heat, which is wasted, in addition to visible light that is desired. Halogen based lighting enables filaments to operate at a higher temperature without premature failure, but again considerable non-visible infrared light is emitted that must be disposed of. This is conventionally done by using a dichroic reflector shade that preferentially passes the infrared as well as a portion of the visible light. The nature of this dichroic reflector is such that it passes several different visible colors as well as the infrared radiation, giving a somewhat pleasing appearance. This has lead to numerous applications for the halogen lights in which the entire light is used for decorative purposes. These lights consume substantial current and dissipate considerable unwanted heat. These bulbs are designed to operate at a variety of voltages between 12 Volts to as high 115 Volts or greater.

Light emitting diodes have operating advantages compared to ordinary incandescent as well as halogen lights. LEDs can emit in a narrow range of wavelengths so that their entire radiant energy is comprised within a predetermined range of wavelengths, eliminating, to a large degree, wasted energy. By combining light colors white can be created. Because such LEDs can now emit in the ultraviolet, the emitted radiation can also be used to excite a phosphor to create white light and other hues.

LEDs have an extremely long life compared to incandescent and halogen bulbs. Whereas incandescent and halogen bulbs may have a life expectancy of 2000 hours before the filament fails, LEDs may last as long as 100,000 hours, and 5,000 hours is fairly typical. Moreover, unlike incandescent and halogen bulbs, LEDs are not shock-sensitive and can withstand large forces without failure, while the hot filament of an incandescent or halogen bulb is prone to rupture.

Halogen bulbs, incandescent bulbs, and LEDs all require a fixed operating voltage and current for optimal performance. Too high an operating voltage causes premature failure, while too low an operating voltage or current reduces light output. Also, the color of incandescent and halogen lights shifts toward the red end of the visible spectrum as current and voltage are reduced. This is in contrast to LEDs, in which only the intensity of the light is reduced. Furthermore, as the voltage to an incandescent and halogen light is reduced, its temperature drops, and so its internal resistance decreases, leading to higher current consumption, but without commensurate light output. In cases where batteries are used as the source of energy, they can be drained without producing visible light.

Incandescent and halogen bulbs require a substantial volume of space to contain the vacuum required to prevent air from destroying the filament and to keep the glass or silica envelope from overheating and to insulate nearby objects from the damaging heat. In contrast, LEDs, being solid state devices, require much less space and generate much less heat. If the volume of an incandescent or halogen bulb is allocated to a solid state LED light, considerably more functions can be incorporated into the lighting product.

Unlike incandescent and halogen lights, LEDs ordinarily produce light in a narrow, well defined beam. While this is desirable for many applications, the broad area illumination afforded by incandescent and halogen lights are also often preferred. This is not easily accomplished using LEDs. The light produced by incandescent and halogen lights that is not directed towards the target performs a useful function by providing ancillary illumination and a decorative function. Halogen lights with their dichroic reflectors do this unintentionally, but ordinary incandescent lights employ external shades, not part of the light bulb, in a variety of artistic designs to make use of this otherwise misdirected light.

LEDs are advantageous in that they consume far less electrical power than incandescent lights, on the order of one-sixth as much power, for a given light output. However, LEDs are subject to thermal damage or destruction at temperatures that are much lower than those tolerated by incandescent bulbs. LEDs are damaged at temperatures exceeding about 150 degrees Centigrade (423° K). This is in contrast to typical incandescent bulbs that typically operate at 3000 to 6000° K.

Additionally, incandescent bulbs are self regulating by increasing the internal resistance of the bulb as power to the bulb is increased. This limits the amount of current that flows through the bulb and maintains the bulb within an operating temperature range that is non-destructive. On the other hand, LEDs are subject to a thermal runaway condition in which excessive power causes the LED to heat and lower the LED internal resistance, which causes more current to flow and more heating to occur. This thermal runaway can cause the operating life of the LED to be severely shortened or may lead to the rapid destruction of the LED.

LEDs can only operate over a relatively narrow operating voltage, typically from about 2 to 4 Volts. Most power sources provide a voltage that is not in the range needed to safely drive the LEDs. Because of this, voltage regulation is required to convert the range of available line voltages, and in some instances battery voltages, into levels that are useful for powering the LEDs.

Voltage regulation is accomplished using electronic circuitry, such as surface mounted electrical components that are mounted to a printed circuit board (PCB). These electrical components can be installed on the PCB along with the LEDs. PCBs are usually made of alternating layers of insulating materials such as fiberglass and copper foil for forming complex circuits. These types of PCBs typically do not efficiently conduct the heat generated by the electrical components and LEDs away from the LEDs. Metal core boards made with aluminum are more efficient at conducting heat away from the LEDs, however these boards are much more expensive and are limited to a single side to contain circuitry. Typical metal core boards and fiberglass/copper PCBs used for high density LED light applications do not have sufficient heat conducting capacities to dissipate more than about 1 Watt away from LEDs. Failure to control the heat at the LEDs can lead to the thermal runaway and subsequent damage of the LEDs.

Dimming LEDs, cold cathode fluorescents and other non-incandescent lighting traditionally involves complex circuits using microprocessors. Most conventional incandescent dimmer controls affect the dimming function by reducing line voltage supplied to the fixture. LED and CFL circuits typically contain regulating circuits to convert incoming line voltage power, typically 110 VAC in the United States, to a voltage/current that is suitable for the LED or CFL. Modulating the line voltage with a conventional dimming circuit does not produce the desired dimming effect on LED and CFL lighting because of the regulating circuits.

One traditional approach to produce dimming capabilities with conventional dimmer switches is to use a microprocessor and analog-to-digital converter (ADC) to sense incoming voltage and to control the regulated circuit such that the perceived result is equivalent to the dimming of a conventional incandescent bulb. In these circuits, the ADC allows the processor to read the incoming voltage, and the processor then produces a pulse wave modulated (PWM) waveform that modulates a control or sensing signal to the power regulator to reduce the resulting brightness responsive to the modulation. Many power ICs designed for lighting applications provide "dimming" control pins specifically for the purpose of allowing for digital control of the brightness in regulators based on those ICs.

It is submitted that microprocessor based dimming controllers add unnecessary expense and complexity to LED lighting systems. The microprocessors are also subject to heat from the LEDs which can affect the reliability of the circuits.

SUMMARY OF THE INVENTION

The present invention overcomes the limitations of halogen or incandescent light sources, and combines their desirable properties with the advantages afforded by LEDs into a unique system and product intended for general illumination purposes.

An embodiment of the present invention may therefore comprise an LED lamp that is capable of replacing standard incandescent and halogen bulbs for a wide variety of purposes. The functionality of this lighting system will go well beyond what is available in ordinary incandescent and halogen lights. Note that standard bulbs frequently are used in fixtures which provide two functions: direct lighting and decorative lighting. The decorative lighting in particular is often associated with a shade, which may alter various properties of some or all the illumination, some of which may be superfluous to the direct illumination function.

This embodiment will contain an electrical connector or base the same as or equivalent to the standard bulb base, a printed circuit board (or other circuit substrate or module) electrically connected to the base, a driving circuit that is mounted on or embodied by the printed circuit board, and one or more LEDs of one or more colors attached to the printed circuit board. The driving circuit comprises a solid state circuit that regulates the voltage and current available from the source and regulates the output to the constant value required for the LEDs. The available source voltage can be either above or below that required by the LEDs.

An additional embodiment to the present invention may also comprise an LED lamp that replaces incandescent and halogen lamps as well as their decorative shades by including LEDs on both sides of the printed circuit (PC) board, where the LEDs are on the opposite side of that intended for direct illumination and where they provide the decorative function. These LEDs may provide a decorative function by illuminating the built-in envelope or shade around the lamp.

An additional embodiment to the present invention may include additional circuitry occupying the volume available. This circuitry may include the following: circuitry to allow remote control of lighting functions via an infrared or wireless device; circuitry to change the color of either or both of the (decorative) shade illumination and the direct illumination LEDs; circuitry that causes a time variant color and or intensity to the (decorative) shade illumination and/or the direct illumination; circuitry that allows the external switching via mechanical action of color, pattern or intensity on either the shade or direct illumination; circuitry that enables the switching of the various functions of color, intensity, pattern by interrupting the power to the circuit within a predetermined time interval.

An additional embodiment to the present invention may include mechanical actuators that alter the pattern and color of light to the shade for the purpose of decorative illumination. This may include a mechanical method such as a shadow screen, multi-faceted mirror or other reflective or diffractive optical component or components either fixed within the envelope of the lighting unit, or provided with a means of moving the internal components to vary the pattern and or color of the resulting light for decorative or functional purposes.

Another embodiment involves a method for regulating current drive through at least one light emitting diode to compensate for temperature induced resistance changes in the light emitting diode. The method includes supplying a source voltage and using the source voltage to create a regulated current that is usable by the light emitting diode. The regulated current is applied to the light emitting diode to cause the regulated current to flow through the light emitting diode. A sense voltage is generated that is related to the regulated current and to a temperature at a position in a thermal pathway of heat emanating from the light emitting diode. The heat is produced by the light emitting diode responsive to the regulated current. The sense voltage is used as a feedback to modify the regulated current to be maintained within a non-destructive operating range of the light emitting diode when the regulated current would otherwise be outside of the non-destructive range due to a decreased resistance of the light emitting diode caused by an increased temperature of the light emitting diode.

Another embodiment involves a current regulator for regulating current through at least one light emitting diode to compensate for temperature induced resistance changes in the light emitting diode. The current regulator includes a source voltage that is connected to a voltage regulator. The voltage regulator is used for regulating the source voltage to create the regulated current and for connection to the light emitting diode to cause the current to flow through the light emitting diode. The current regulator also includes a sense voltage generator for generating a sense voltage that is related to the current and to a temperature at a position in a thermal pathway of heat emanating from the light emitting diode. The sense voltage is used as a feedback to modify the regulated current to be maintained within a non-destructive operating range of the light emitting diode when the regulated current would otherwise be outside of the non-destructive range due to a decreased resistance of the light emitting diode caused by an increased temperature of the light emitting diode.

Another embodiment involves a method for removing heat from at least one high power light emitting diode having an integral metal slug for transferring heat away from the light emitting diode. A printed circuit board is configured to electrically connect to the light emitting diode to generate light. At least one via is arranged in the printed circuit board in a location to contact the metal slug to transfer heat from the light emitting diode through the metal slug to the via. A heat sink is arranged in thermal communication with the via to receive heat from the via and to transfer the heat to the ambient environment.

Yet another embodiment involves an arrangement for removing heat from at least one high power light emitting diode having an integral metal slug for transferring heat away from the light emitting diode. A printed circuit board is electrically connected to cause the light emitting diode to generate light. At least one thermally conductive via in the printed circuit board is positioned in a location that is in thermal communication with the metal slug. A heat sink receives heat from the via and transfers the heat to the ambient environment.

Another embodiment involves a method for removing heat from at least one high power light emitting diode having an integral metal slug for transferring heat away from the light emitting diode. A printed circuit board is configured to electrically connect to the light emitting diode to generate light. The printed circuit board is arranged to define a hole adjacent to the metal slug. A heat sink is connected to the metal slug through the hole in the circuit board to transfer heat from the light emitting diode to the ambient environment.

Another embodiment involves an arrangement for removing heat from at least one high power light emitting diode having an integral metal slug for transferring heat away from the light emitting diode. The arrangement includes a printed circuit board that is electrically connected to the light emitting diode to generate light. The printed circuit board defines a hole adjacent to the metal slug. A heat sink is connected to the metal slug through the hole for transferring heat from the light emitting diode to the ambient environment.

Another embodiment involves a method of dimming at least one light emitting diode. A source voltage is supplied and is regulated to create a regulated voltage that is within a voltage range which is usable by the light emitting diode. The regulated voltage is controlled through feedback that is at least partially based on the source voltage such that a change in the source voltage produces a predetermined change in the regulated voltage.

Another embodiment involves a dimmer apparatus for use in dimming at least one light emitting diode. A voltage regulator receives a source voltage that is not in a range that is usable by the light emitting diode and receives a feedback signal. The voltage regulator generates a regulated voltage that is within a voltage range that is usable by the light emitting diode. The regulated voltage is generated at a level that is at least partially determined by the feedback signal. A feedback controller creates the feedback signal based at least in part on the source voltage such that a change in the source voltage produces a predetermined change in the regulated voltage.

An additional embodiment of the present invention may comprise the method or methods for accomplishing the above-mentioned attributes.

DETAILED DESCRIPTION OF THE INVENTION

Figure 1:
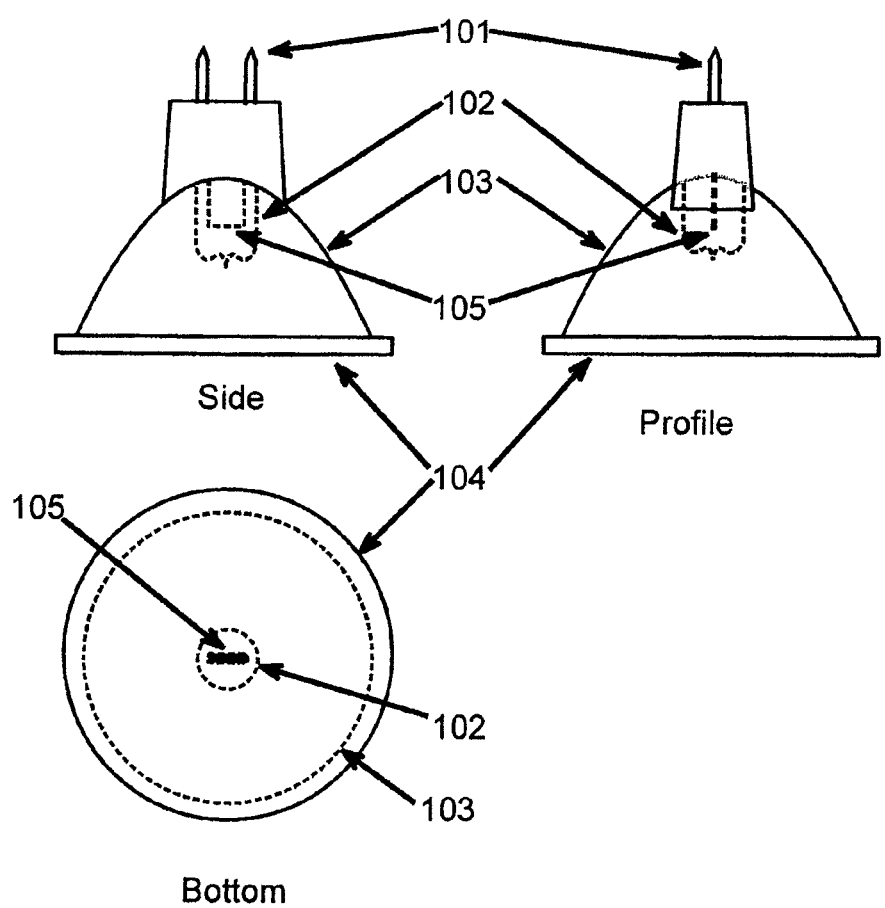
FIG. 1 illustrates an example of the current state-of-the-art halogen illumination device referred to commonly as an MR-16.

While this invention is susceptible to embodiment in many different forms, there are shown in the drawings, and will be described herein in detail, specific embodiments thereof with the understanding that the present disclosure is to be considered as an exemplification of the principles of the invention and is not to be limited to the specific embodiments described.

FIG. 1 illustrates an incandescent halogen type bulb commonly available. The features of this bulb have been derived from the operating characteristics implicit in the operation of these type illumination devices: they operate at high temperatures; they require an evacuated envelope separated from the hot filament; they emit large quantities of infrared radiation experienced by the user as heat; and they consume large quantities of electrical power. Nonetheless these devices are in common usage and fixtures and appliances have been constructed to accommodate the form, fit, and function of these bulbs. This particular unit is a model MR-16.

FIG. 1 illustrates the incandescent halogen bulb and its essential components. These are a connector 101 that attaches to a standard source of electrical power which has a mating adapter; an evacuated transparent capsule 102 containing the hot filament 105; an envelope 103 that acts as a shade and filter to allow infrared radiation to pass, while reflecting a portion of the desirable visible light to the objects below; a transparent front cover 104 that allows the radiation to pass, while protecting the evacuated capsule 102 from breakage.

In contrast to incandescent lights, LEDs consume less power, emit in a narrow beam, emit less heat, and can be formulated in a wide variety of colors both inside and outside the spectrum visible to humans. Because of these implicit differences, the use of LEDs creates opportunities to add operation features to light bulbs, which heretofore were considered simple illumination devices. It is the object of this disclosure to enumerate unique features that will improve the usefulness of the lighting devices based on LEDs.

Figure 2:
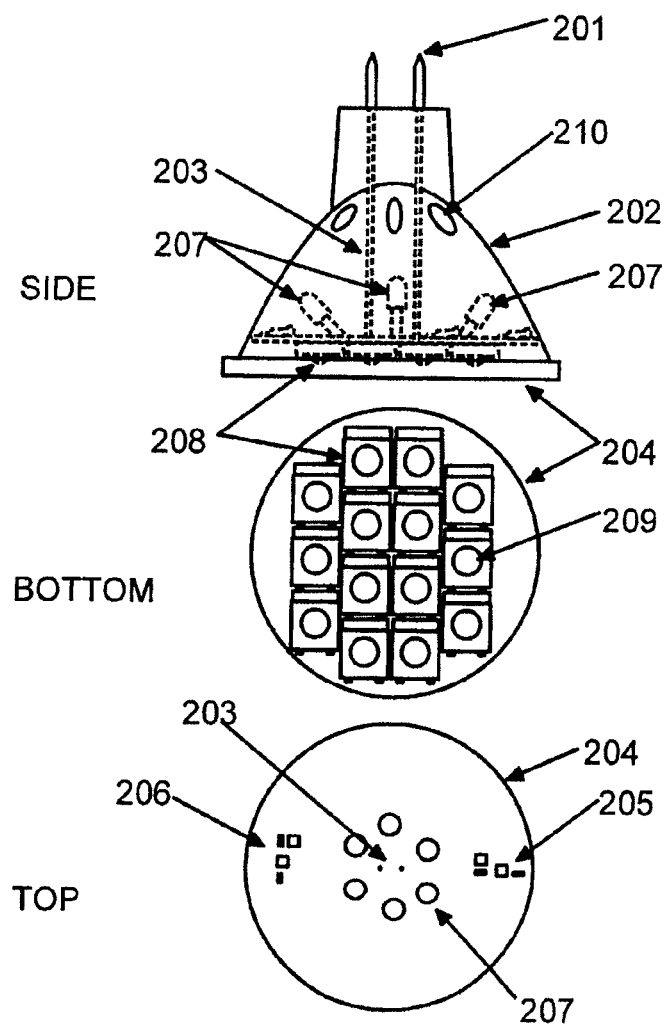
FIG. 2 illustrates an embodiment of the present invention that can retrofit the halogen illumination device and contains LEDs for illumination on one side and LEDs for direct illumination on the other. Circuitry to enable regulation and other features is also shown.

FIG. 2 illustrates the first embodiment of the current invention. This illuminating device is intended to have the same form fit and function as the incandescent illumination device of FIG. 1 and as such has a similar electrical connector 201 and similarly shaped transparent or translucent envelope 202. The envelope 202 will act to scatter light emitted from inside the envelope and be visible from the outside. As such, the envelope 202 can serve as a screen onto which are projected and displayed images, colors or other decorative or information-containing light either visible to humans or at shorter or longer wavelengths. The content of this information is formulated by circuitry contained on one or more circuit boards 206 contained within the envelope of the bulb 202. This circuit 206 in its simplest form controls other illumination devices such as the LEDs 207 also located on the back of the circuit board 204. Another circuit 205 can be used to control high power LEDs 209 in an array 208 located on the opposite side for direct illumination of objects outside the envelope of the lighting device. However, this circuit or circuits may enable several useful features. These are:

1. A timer to adjust the color and illumination level according to some preset or user-adjustable schedule.
2. A photocell to turn on or off the light depending on the ambient light level and or a proximity sensor.
3. A signaling function that communicates with other lights
4. A switch that is user accessible that allows a switching of illumination characteristics such intensity, color, continuous or flashing illumination modes.

Also located on circuit board 204 is a power conditioning circuit 205 that regulates power to the high intensity LEDs 208 located on the underside of the board. This circuit adapts and controls the power available via the connector 201 and conducted to the board via wires 203. The circuit 205 may contain storage features including a battery to enable the lighting device to act as an emergency light source in the event of a power failure. The circuit may rectify ac power to dc to suit the desired current and voltage required by the series and/or parallel array of LEDs and provide power to other on-board circuitry.

In this embodiment, the LEDs 207 on the backside of the PC board 204 can serve the function of communication and or decoration. For decorative purposes, the shade 202 will be made of a colored or white transparent or preferably translucent material such as plastic or glass which is textured so as to scatter light. In this manner light from the LEDs 207 impinge on this surface and are made more visible to the user, and can serve the function of decoration. The shade 202 may also contain penetrations 210 to allow heat to exit the LED enclosure.

Figure 3:
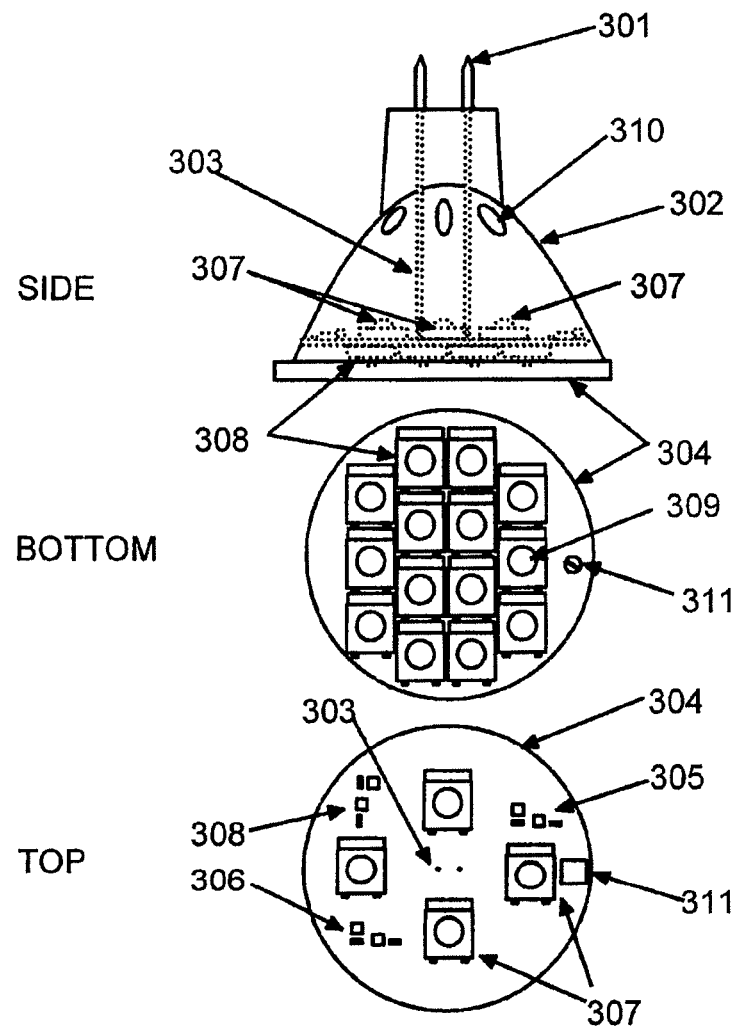
FIG. 3 illustrates an embodiment of the present invention in which high intensity LEDs are placed on both sides to produce shade illumination and direct illumination. A switch and circuitry for changing the attributes of the lighting is also shown.

FIG. 3 illustrates a similar incandescent replacement product. This product also contains an electrical connector 301, a shaped translucent or transparent envelope 302 with holes 310 to remove heat, one or more printed circuit boards 304 within the enclosure, means such as wires 303 to conduct electrical power to these board(s), the product now has high intensity illumination LEDs 307 on the top surface and other high intensity LEDs 309 in an array 308 on the bottom surface. Unlike the product of FIG. 2 which had small LEDs with a narrow exit beam and low intensity, these high intensity LEDs 309 and 307 have a higher light output generally greater than 10 lumens and the exit angle of the light may range from a narrow angle to a very broad beam as desired. To control these LEDs additional circuitry may be required as shown in the figure. In addition to the power transforming circuit 305, and the control circuits 306, additional power handling circuits 311 may be necessary. These high power LEDs may have one or more colored light outputs other than white, and have different orientations other than vertical to provide decorative illumination above the lighting product. A switch 311 that is accessible by the user can be used to control characteristics of operation of the lighting product.

Figure 4:
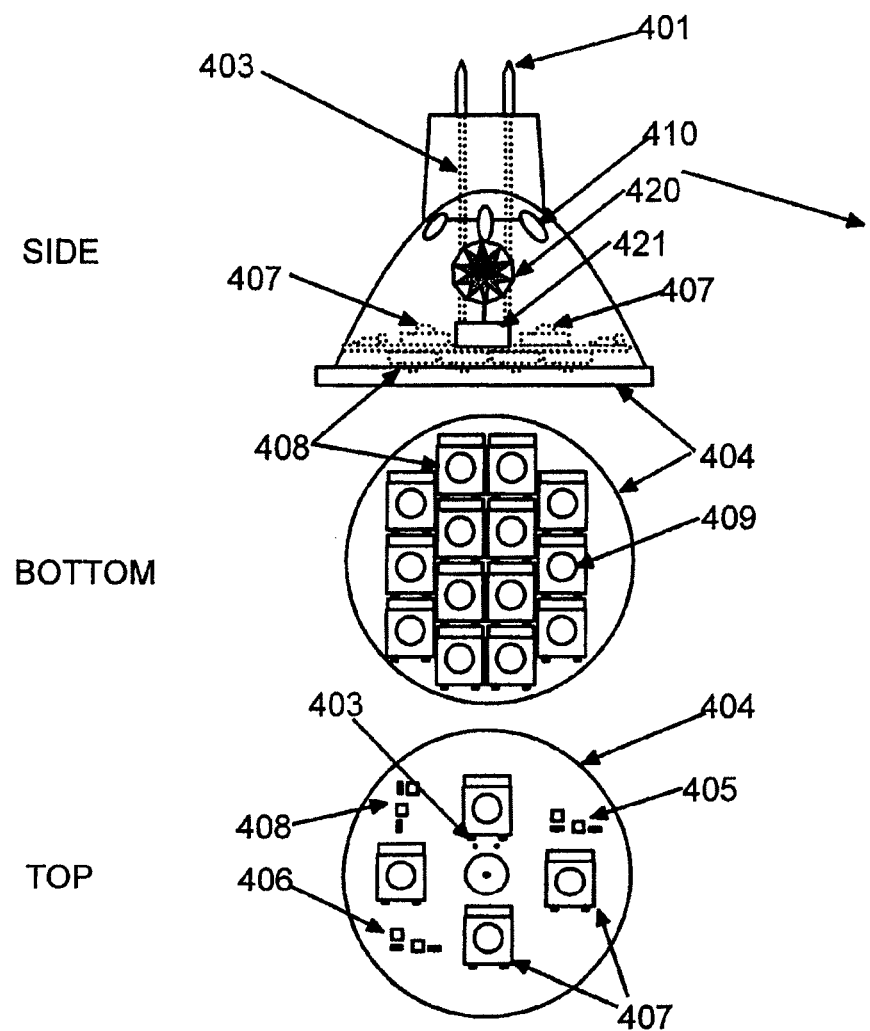
FIG. 4 illustrates another embodiment of the present invention in which a movable, multifaceted mirror is included on the shade side of the illumination unit to provide a variable pattern on the shade.

FIG. 4 illustrates another embodiment of the product. Unlike the previous examples in which modification of the color, intensity and pattern took place by electrically controlling the electrical power to individual devices of one or more orientations and color, this product contains a mechanical method for varying the intensity, and pattern with time. This is accomplished for example using a multi-faceted mirror 420, operated by a miniature electric motor 421 that changes the orientation and position of the mirror. In this way light is reflected or diffracted to form a pattern of shapes and color on the translucent or transparent envelope 402.

Figure 5:
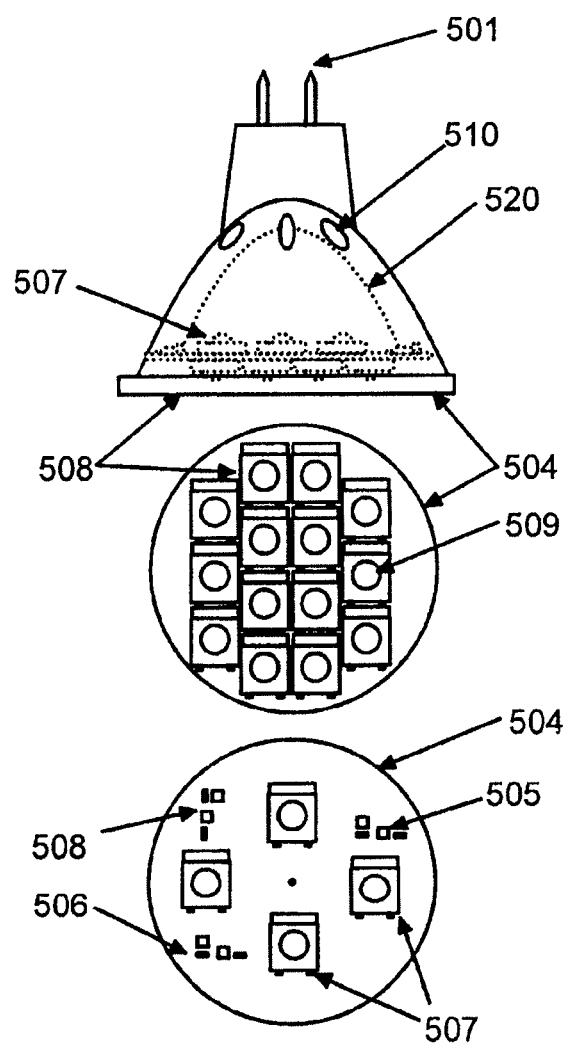
FIG. 5 illustrates another embodiment of the present invention in which an internal fixture containing apertures is included to pattern illumination to the shade.

FIG. 5 illustrates another embodiment in which is added the feature of a patterned mask 520 that casts a shadow or other optical means a predetermined pattern by blocking or otherwise modifying the pattern of light emanating from the internal LEDs 507 located on the back side of the circuit board 504. Other features from other embodiments discussed already may also be incorporated.

It may be appreciated from these descriptions that the LEDs used in these embodiments, though small, occupy considerable space that limits the overall light output of the product. This is due to the need to provide electrical connections to each of the semiconductor light emitting chips that are housed in large packages that provide both electrical connections and a means for removing heat and permit the exiting of useful light. The packages also often contain a lens or mirror for shaping and directing this light. While these packages allow some freedom of use, they also limit the density and eliminate the means to provide the integration of the functions of heat dissipation, light direction and electrical connection by independent means. Many of these functions could be accommodated within a printed circuit board of appropriate design for a group of devices at the same time and within the circuit as it is formed.

Figure 6:
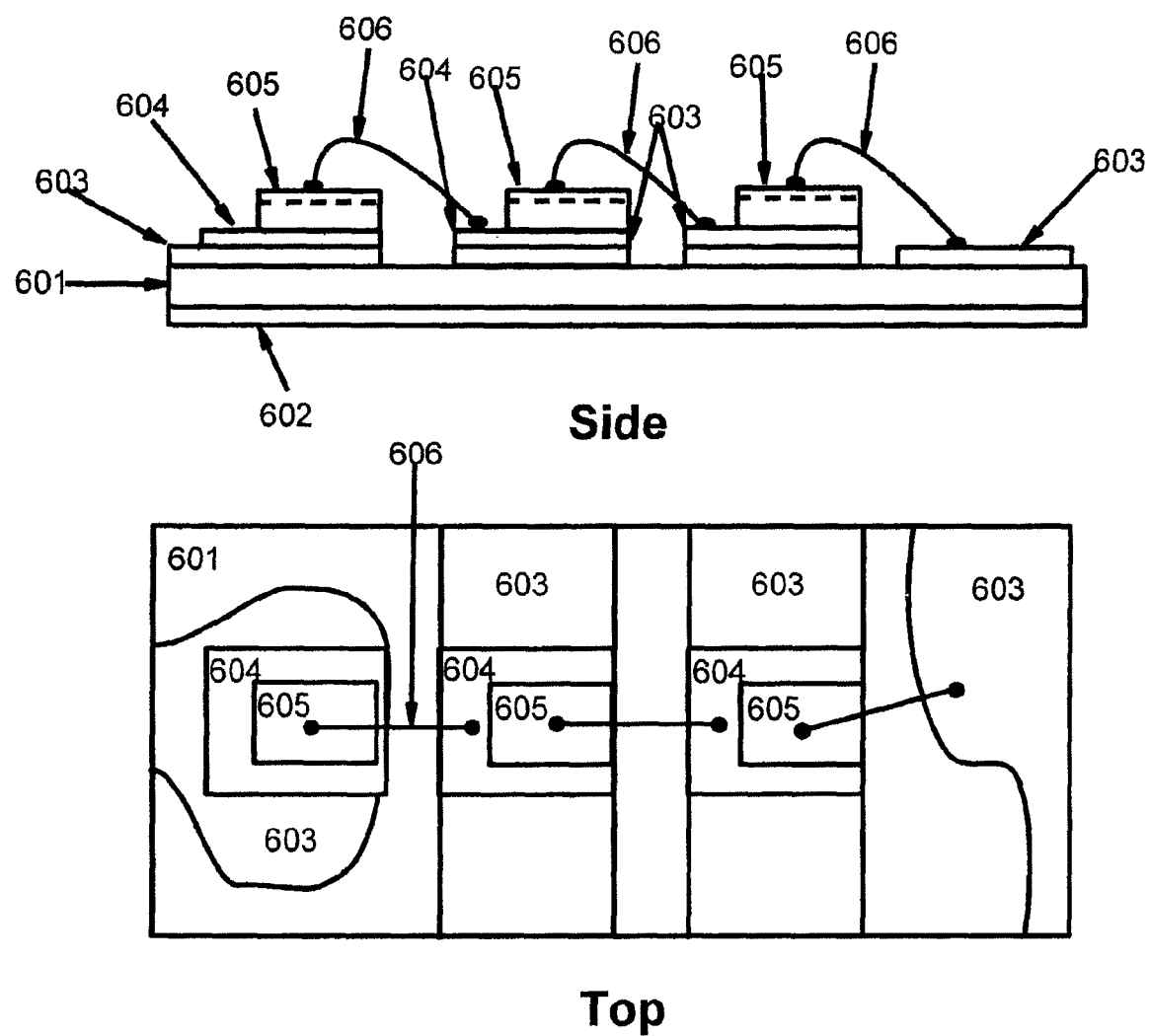
FIG. 6 illustrates a means for producing a series/parallel circuit comprised of individual LED semiconductor chips on a circuit board that results in a high density lighting array.

One means of improving the light density of the overall product is to incorporate the light emitting dies onto a suitable patterned circuit board that contains the external circuitry needed to power and connect the LED devices without the excess baggage of a package. FIG. 6 illustrates such an arrangement. The embodiment consists of a printed circuit board comprised of at least a middle portion 601 that may be the usual fiberglass core or one that contains metals, ceramics or other materials to enhance thermal conductivity, a top metal clad layer 603 and a bottom cladding layer 602. It should be well understood that these top and bottom layers can easily be patterned by such processes as etching. A light emitting assembly can be attached to the patterned surface of cladding 603 by cementing with a thermally and electrically conducting compound or by welding or some other method. Then the cladding 603 may act as either or both a thermal and electrical conducting pathway. The light emitting assembly consists of a metal base 604 to which is bonded a semiconductor light emitting chip 605. This light emitting chip contains a pn junction that emits light and conducting top and bottom surface layers for electrical and thermal contact. A conducting wire or tab connects the top conducting member of the junction to the opposite conducting pad on the next assembly, thus building up a circuit that is in series. Using a different connection scheme, but the same general method, a parallel connection can be assembled. By doing this, a relatively dense build-up of light emitting chips can be assembled using the thermal and electrical transfer characteristics of the printed circuit board. Furthermore, heat sinking, cooling or other components can be attached to the board, improving performance, for example on the back side 602 of the printed circuit board. Although not shown, it should be understood that this connection method can be extended in the two dimensions of the plane of the board.

Such chips as illustrated in FIG. 6 will emit light in all directions. Such a distribution of light may not be desired for any lighting applications. Therefore, a matching array of lens that is positioned over the light emitting chips would be desirable. This separation of the top lens array from the LEDs is desirable as it allows the lens array to be positioned independently, allowing the light directed by the lens to be moved and/or focused by moving the lens array in the three dimensions. The movement can be controlled via a variety of methods such as stepper motors or piezoelectric activated motion controllers whose support electronics is also contained on the printed circuit board. The array of lenses can be molded from a transparent clear or colored material with a variety of spherical or hemi-spherical shapes.

Figure 7:
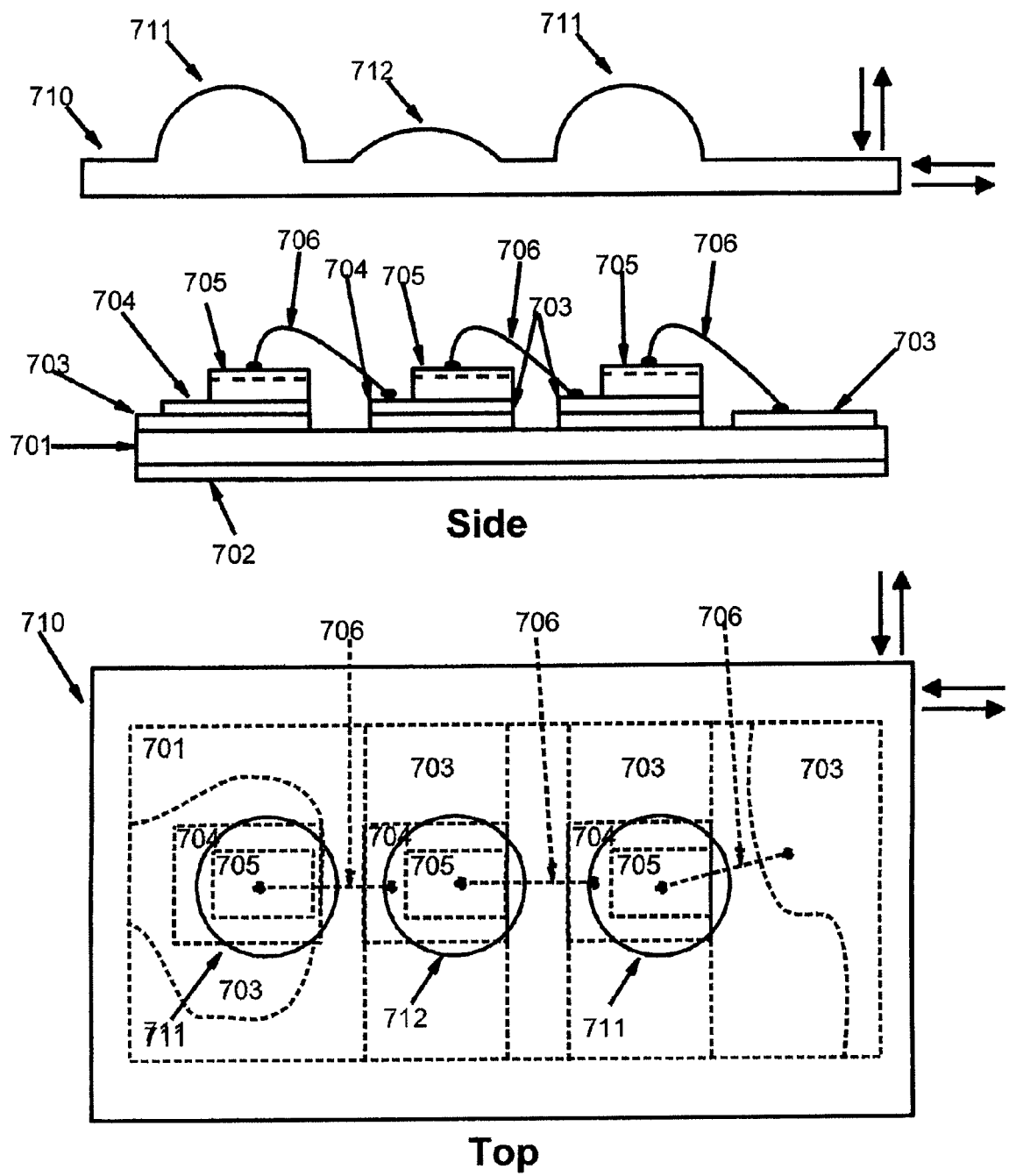
FIG. 7 shows an embodiment of the high density LED array in which it is coupled with an integrated lens array that is movable to produce variable directional lighting.

FIG. 7 illustrates such an arrangement. The PC board 701 containing patterned metal traces 703 has located on its surface light emitting portions consisting of semiconductor light emitting devices 705 that are mounted on bases 704. These areas are bonded together with electrically conducting wires or strips to form a series/parallel circuit. Positioned over the top of these light emitting regions is a lens array 710 into which have been formed by a method such molding, a matching series of optical elements. Three such elements of two different shapes labeled 711 and 712 are shown. This lens array 710 is spaced apart from the semiconductor array and mounted in such a manner that it can be externally manipulated in one or more of the three dimensions as shown by the opposing pairs of arrows. Hence, by moving the lens array, the light emitted from the matching LED array can be directed and focused as required, in essence steering the light beam. This can be controlled by onboard electronics, and via remote control or such other means as required such as proximity sensors, timers and the like.

These lighting products require a source of alternating (ac) or direct current (dc). Although LEDs utilize direct current, it is possible to use the LEDs to rectify ac power provided the number of LEDs is chosen to match the ac voltage. It is well understood how to transform ac power to dc via a variety of well-established methods. The use of dc power as supplied by batteries however, presents some problems because as the battery voltage declines under load, the current drawn by the LEDs rapidly declines, owing to the extremely non-linear current-voltage characteristic inherent in a diode. Since the light output of a LED is directly proportional to current, this means the light output rapidly declines. On the other hand, if battery voltage exceeds a predetermined level, heating of the semiconductor junction that comprises the LED is excessive and can destroy the device. Moreover, excess heat in the LED junction causes a condition called thermal runaway, in which the heat raises the current drawn at a given voltage, leading to further heating, which in turn leads to greater current draw and quickly destroys the device. This is especially a problem with high power LEDs and requires careful thermal management.

In order to help avoid this problem it is useful to fix the current through the LEDs rather than the voltage. Using a battery as the source of current however presents a problem because of the differing voltage and current behavior of the battery power source and the LED load. Therefore, a circuit is desired to regulate and fix the current independent of the voltage supplied by the battery. In the case where the battery voltage is less than the load voltage required by the series and/or parallel LED circuit, a boost circuit can be used as pictured in FIGS. 8*a* and 8*b*. In this circuit an integrated circuit device, IC1 801 is used to control the charging and discharging of an inductor L1 803. This integrated circuit may be one of several that are available such as the Texas Instruments TPS61040. After a charging cycle, the IC switches the circuit so that the inductor L1 803 is permitted to discharge through the load, which in this case is the light emitting diodes 805. The current is controlled via a feedback resistor R1 806. The value of the resistor is chosen to fix the maximum current that is permitted to flow through the load, which in this case, is one or more LEDs (LED1, LED2) shown as 805. This manner of control occurs because the voltage drop across R1 806 is compared to an internally generated reference voltage at pin FB of IC1 801. When the two voltages are equal the current is considered fixed and will be controlled to that predetermined value. A diode D3 802 is used to ensure protection of the IC1 801 in case the battery source (not shown) is connected backwards. The diode 804 allows current flow through the LEDs 805 in only the forward, or light emitting direction. In this invention, such a circuit would be enclosed within the envelope of the bulb.

FIG. 8*b* differs from FIG. 8*a* in that it builds into the circuit an easy and inexpensive means of protecting the LEDs from excessive current flow and the runaway that results from high temperatures. In this circuit a resistor with a positive resistance rate of change with temperature, R2 807 is placed in series with a fixed resistor. Resistor R2 is physically located on the circuit board so as to be placed in the thermal pathway of heat emanating from the LEDs 805. Therefore, when the temperature of the LEDs 805 increases, the resistance of R2 807 also increases, and its resistance is added to that of R1 806. Since the voltage drop across these combined resistances appears on the feedback pin FB of IC1 801, the increased voltage is interpreted as a request for decreased current. Hence, the natural tendency of the LEDs 805 to draw more current that would ordinarily lead to the failure of the part is averted by introducing a self-limiting control function.

This circuit has the advantage of being very efficient and compact and having built into it a temperature regulation that allows the resulting system to automatically adapt to the thermal environment in which it is placed. Because of these attributes, it can, for example be put into a miniature lamp base of the kind used for flashlights (PR type flange base).

Figure 8:
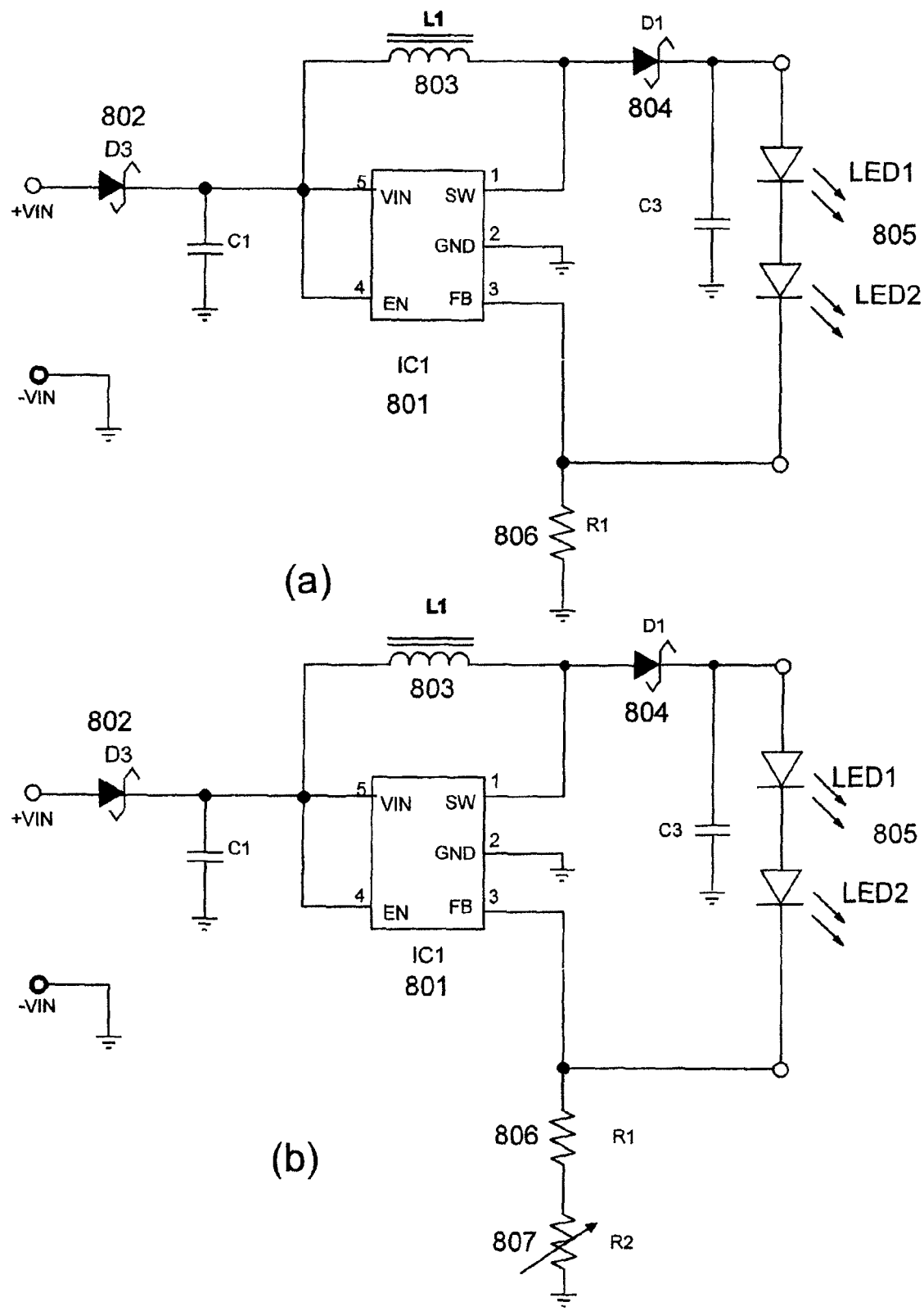
FIG. 8 is a constant current implementation of a compact dc/dc boost converter with a feature that enables current regulation of the LEDs based on the thermal environment.

However, the remaining limitation of the circuit is that it can only boost voltage from a lower value to a higher value required by the LED load. Therefore, in situations where only one LED is required, but a higher input voltage is all that is available, the excess voltage will appear across the LED even if the circuits in FIG. 8 are used. This will cause an excessive current to be drawn, leading to premature failure of the LED and premature draining of the battery. To solve this problem we require a circuit that is still compact enough to fit into a bulb or bulb base, and that is capable of either raising or lowering the output voltage above or below the voltage of the incoming battery or other dc supply in order to maintain the desired current through the LED load. Hence this circuit would either boost the voltage if the input voltage were lower than required by the LED or reduce the voltage if it were higher than that required to sustain the necessary constant current through the LED. It is understood that LED here may refer to one or more LEDs in a series, parallel or series/parallel circuit. Furthermore, because of the deleterious effects of temperature, this circuit must have the ability to regulate the current through the LED depending on the ambient temperature. The ambient temperature may be determined by the environment as well as heat dissipated by the circuit and the LED.

Figure 9:
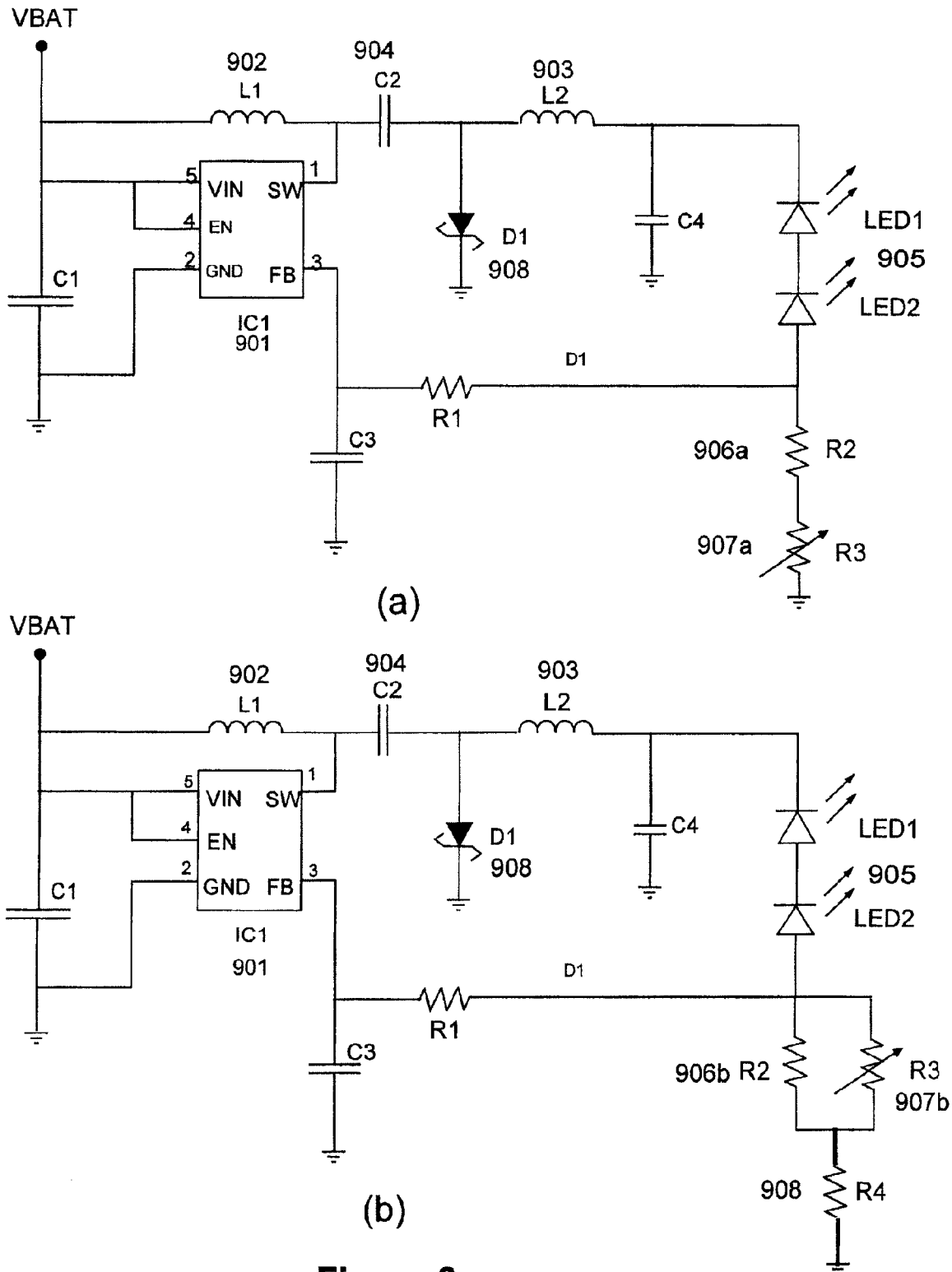
FIG. 9 is a compact constant current buck/boost circuit in which several methods that enable current regulation based on the thermal environment are illustrated.

Such a circuit is disclosed in FIG. 9. This circuit utilizes a so-called Cuk converter that is ordinarily used as an inverting switching voltage regulator. Such a device inverts the polarity of the source voltage and regulates the output voltage depending on the values of a resistor bridge. In this invention, the inverter circuit has been altered in a unique fashion so that it acts to boost the voltage output or buck the voltage input in order to maintain a constant current through the load represented by one or more LEDs 905. The circuit incorporates an integrated circuit IC1 901 such as the National Semiconductor LM2611 Cuk Converter or equivalent. In this circuit, IC1's internal transistor is closed during the first cycle charging the inductor L1 902 from the battery source indicated as Vbat. At the same time the capacitor C2 904 charges inductor L2 903, while the output current to the LEDs 905 is supplied by inductor L2 903. In the next cycle the IC1 901 changes state to permit the inductor L1 902 to charge capacitor C2 904 and L2 903 to discharge through the LEDs 905. The control of the charging power and current through the load is performed by the resistor network consisting of R2 906*a* and R3 907*a*. The overall value of these resistors together with the current passing through the LEDs 905 from ground, sets a voltage that appears on the feedback pin (FB) of IC1 901. Resistor 907*a* has a positive temperature coefficient so that its resistance increases with temperature.

Because of thermal effects such as heat dissipation by the LEDs, heat produced by the IC1 or other circuit components and the ambient environmental conditions, the current must also be altered to accommodate these changes. This is affected by a temperature dependent resistor R3. In FIG. 9*a*, resistor R3 907*a* has a positive temperature coefficient in which the resistance increases with temperature. The additive effect of the series circuit with R2 906*a* means that as temperature rises, the overall resistance of the combination does also, leading to an increase in voltage drop. This in turn causes IC1 to decrease the output current to the LEDs 905. In FIG. 9*b* the resistor network is comprised of resistors in parallel and series. In this instance, resistors R2 and R4 906*b*, 908 are fixed and resistor R3 907*b* is temperature dependent with a positive temperature coefficient. The use of a parallel arrangement allows a greater freedom of choice of temperature dependence than a simple series arrangement.

Figure 10:
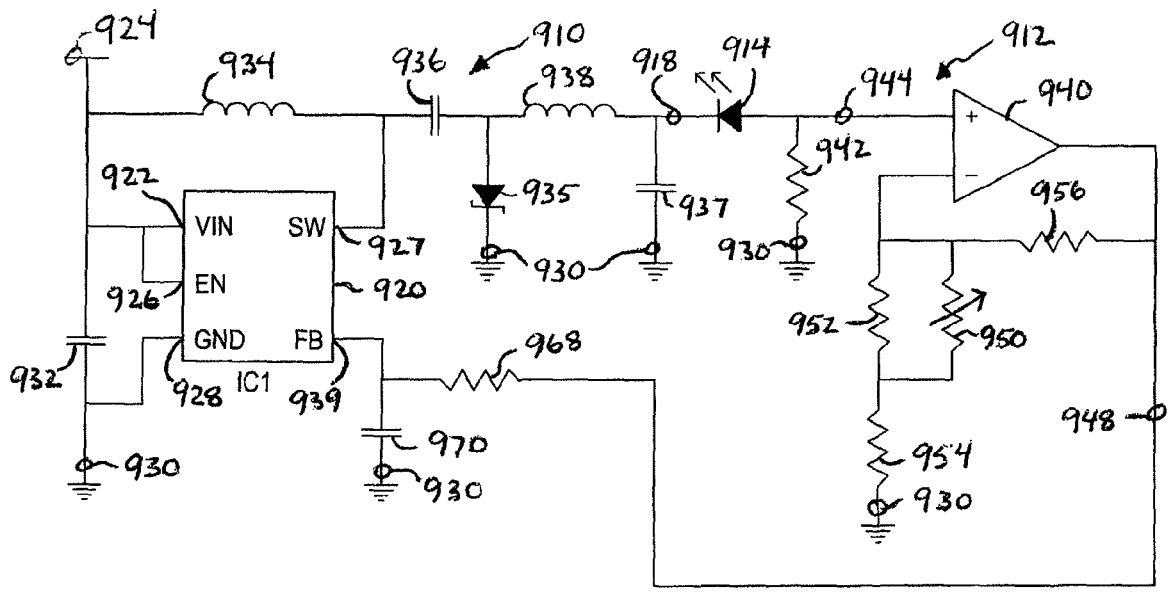
FIG. 10 illustrates one embodiment of a current regulator with temperature dependent LED feedback.
Figure 11:
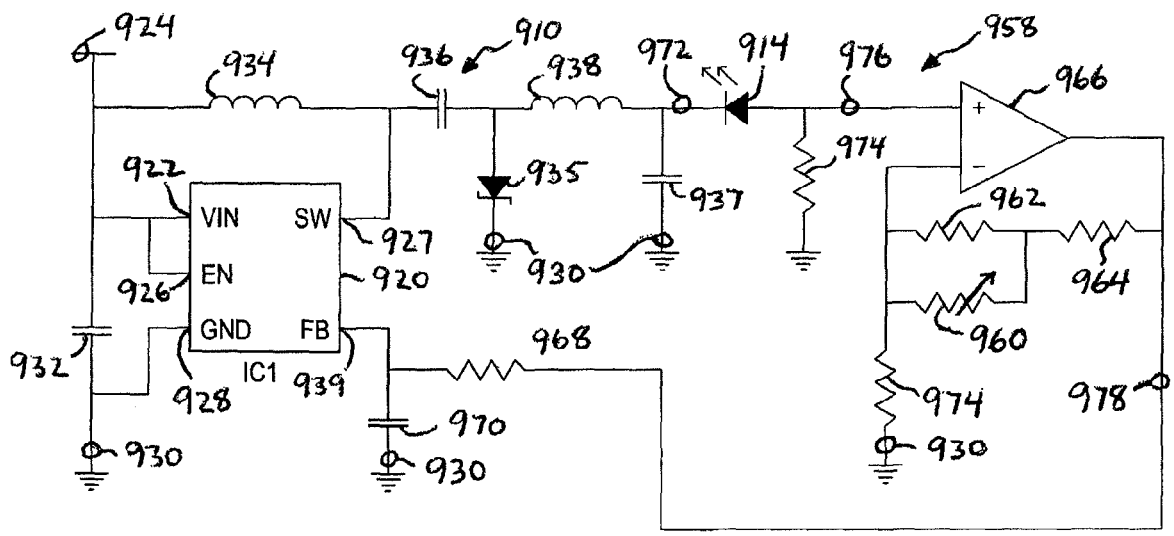
FIG. 11 illustrates another embodiment of a current regulator with temperature dependent LED feedback.

Other embodiments of temperature dependent control of the power supplied to LEDs are shown in FIGS. 10 and 11. A LED current controller 910, FIG. 10, includes a temperature dependent feedback circuit 912. Feedback circuit 912 provides a sense voltage 948 that is dependent on temperature at or near LED 914 to current controller 910. The temperature dependent feedback causes current controller 910 to regulate LED current 918 to LED 914 to maintain the current within a safe operating range that will not damage the LED. The temperature dependent feedback prevents the LED current from moving out of the safe operating range due to changes in resistance of the LED caused by changes in temperature. While FIGS. 10 and 11 illustrate concepts with only one LED, it should be understood that these concepts are equally applicable for use with multiple LEDs where the circuit can simultaneously drive a plurality of LEDs.

Current controller 910 includes a regulator IC 920, which can be arranged similar to the Cuk Converter shown in FIG. 9. Regulator IC 920 in the present example includes a source voltage input 922 that is connected to a source voltage 924. Source voltage 924 provides the power for the regulator and the LED and is also connected to a chip enable pin 926 of the regulator. In the present example, source voltage 924 is a DC voltage. A ground pin 928 of regulator IC 920 is connected to ground 930. Capacitor 932 connects between source voltage 924 and ground 930 to reduce or eliminate AC voltage variations from source voltage 924. A supply pin 927 provides controlled current to the LED as the drive current of the LED. Temperature dependent feedback of the current controller can also be applied to the controller shown in FIG. 8, except that the light emitting diode must be reversed in this instance.

Regulator IC 920, such as the National Semiconductor LM2611, operates to boost or buck the source voltage to maintain the LED current within the safe operating range of the particular LED used. Similar to the operation described above, an internal transistor of regulator IC 920 is closed during a first cycle to charge inductor 934 from source voltage 924. At the same time, capacitor 936 charges an inductor 938 while LED current 918 is supplied by inductor 938 to LED 914. In the next cycle, regulator IC 920 changes state to permit inductor 934 to charge capacitor 936 and to allow inductor 938 to discharge through LED 914.

The safe operating range or non-destructive range of the LED is a range of currents within which the LED is designed to operate without the temperature of the LED exceeding the temperature at which the LED is damaged. By reducing the current to the LED, the temperature of the LED can be reduced or maintained below the damage temperature of the LED. The damaging temperature of the LED, and the non-destructive current range that maintains the LED below the damaging temperature, can be determined based on the circuit that the LED is connected with. The damaging temperature of the LED, or the safe operating temperature of the LED is typically available from the LED manufacturer.

In the present example diode 935 is connected between ground and a point between capacitor 936 and inductor 938. Diode 935 acts as a switch to control current flow to a single direction. Capacitor 937 is included in the circuit to provide a filtering function to help maintain a constant voltage and therefore current through the LED.

Regulator IC 920 includes a feedback pin 939 which is used for controlling the output at supply pin 927. Increased voltage at feedback pin 939 is interpreted as a request for decreased current at supply pin 927 and decreased voltage at feedback pin 939 is interpreted as a request for increased current at supply pin 927.

Feedback circuit 912 includes an operational amplifier 940 that is connected (not shown) to the source voltage and ground for power. Op amp 940 produces sense voltage 948 as an output that is based on a input voltage 944 at a non-inverting (+) input and an amp feedback voltage 946 at an inverting (−) input. Sense voltage 948 is connected to feedback pin 939 of the regulator IC.

In the present example, a sense resistor 942 is connected between LED 914 and the ground. Sense resistor 942 is also connected to the non-inverting input of op amp 940. When LED current 918 flows through sense resistor 942 sense voltage 944 is produced on the non-inverting input of op amp 940. Input voltage 944 is proportional to the LED current in the present example because sense resistor 942 has a fixed resistance.

Amp feedback voltage 948 results at least in part from the use of a temperature dependent resistance. In feedback circuit 912, shown in FIG. 10, the temperature dependent resistance is a thermistor 950 that has a negative temperature coefficient (NTC). NTC thermistor 950 is connected in parallel with parallel resistor 952 and the parallel thermistor 950 and resistor 952 are arranged in series with series resistor 954. Thermistor 950 and resistors 952 and 954 are arranged between the inverting input of op amp 940 and ground 930. An op amp feedback resistor 956 is connected between the output and the inverting input of the op amp.

NTC thermistor 950 has a resistance that goes down as temperature increases. Decreased resistance, resulting from increased temperature, causes op amp 940 to have an increased gain in the configuration shown in FIG. 10. Sense voltage 948 increases when the gain of op amp 940 increases.

Sense voltage 948 is connected to the feedback pin of the regulator IC through a low pass filter that includes a resistor 968 and capacitor 970. The RC filter may slightly attenuate sense voltage 948. Since sense voltage 948 is connected to the feedback pin of the regulator IC, increased sense voltage causes the regulator IC to produce a decrease in LED current.

Another feedback circuit 958, shown in FIG. 11, uses a thermistor 960 that has a positive temperature coefficient (PTC) as the temperature dependent resistance. Feedback circuit 958 is another example of a circuit that can be used for temperature dependent control of power to LEDs. Feedback circuit 958 can also be connected to a current controller as described above and will therefore be discussed in conjunction with a current controller like the one shown in FIG. 10.

In the present example, LED 914 is connected between capacitor 937 and a non-inverting input (+) of an op amp 966. A LED current 972 flows through the LED and a sense resistor 974 to cause the LED to emit light. LED current 972 flowing through sense resistor 974 creates an input voltage 976 at the non-inverting input of op amp 966.

PTC Thermistor 960 is connected in parallel with a parallel resistor 962 and the thermistor 960 and resistor 962 are connected in series with a series resistor 964. Thermistor 960 and resistors 962 and 964 are arranged in a feedback loop between the output and inverting input of op amp 966. A drain resistor 974 connects the inverting input of op amp 966 to ground 930.

PTC thermistor 960 has a resistance that goes up as temperature increases and goes down as temperature decreases. In the arrangement shown in FIG. 11, increased resistance of PTC thermistor 960 resulting from increased temperatures causes an increase in sense voltage 978. Since sense voltage 978 is connected to feedback pin 939 of regulator IC 920, through the low pass filter, the regulator IC responds by decreasing current at supply pin 927 which reduces LED current 972.

In the examples shown in FIGS. 10 and 11, the simple resistor circuit shown in FIG. 9 is replaced with a circuit that includes a relatively smaller temperature sensitive component that controls feedback to the current regulator. Because the absolute change in resistance of the temperature sensitive component may be small, an amplifier is used to amplify the sense voltage across the temperature sensitive component to provide adequate feedback to the current regulator.

In high current applications, the power loss through sense resistors R2 807 (FIG. 8*b*), R3 907*a* (FIG. 9*a*) and R3 907*b* (FIG. 9*b*) can become a significant contributor to the heat generated by the system. Feedback controllers 912 and 958 replace the single passive sense resistor in previous embodiments with active circuits that use much smaller sense resistors that produce less heat.

Other temperature sensitive elements that exhibit a change in electrical characteristic as a function of temperature can also be used. These elements can be either active or passive and may require additional circuitry to provide adequate feedback. In some instances, in may be necessary to include additional circuitry around a temperature dependent component in order to scale the temperature dependent changes to a magnitude that is useful for modifying the current sense voltage. In some instances, such as the examples using the thermistor or a diode, the temperature dependent component may be placed in parallel and/or series with one or more fixed resistors to bring the voltage and/or current into a range that is useful in controlling feedback.

The temperature dependent resistance devices or other temperature dependent elements are positioned in the thermal pathway of heat emanating from the LED. The temperature dependent device may be located in contact with the LED, either directly or through some other element. In these instances, the heat is conducted to the temperature dependent device before it is transferred to the air or atmosphere. In other instances, the thermal pathway to the temperature dependent device may include air or some other fluid medium.

Figure 12:
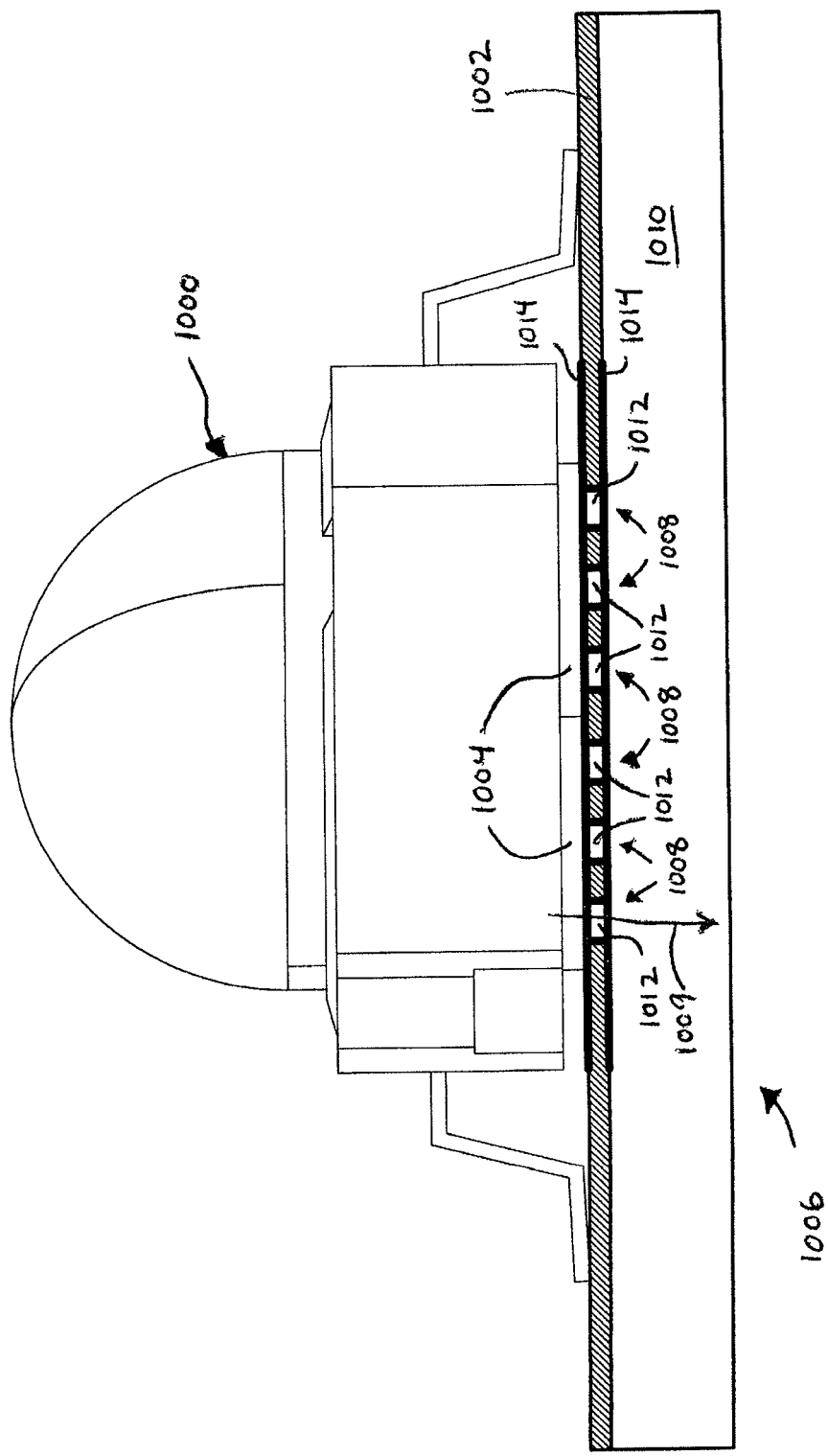
FIG. 12 illustrates an embodiment of a heat conducting apparatus for removing heat from the LEDs.

In some instances, a heat sink formed, for example, from a metal, is needed to conduct heat away from high power LEDs to avoid damaging them. A high power LED 1000 is shown in FIG. 12 in partial cross section connected to a printed circuit board (PCB) 1002 which includes circuitry for powering the LED. High power LED 1000 has an integral metal slug 1004 that contacts the light producing semiconductor die (not shown) of the LED. High power LEDs with integral metal slugs are known in the art. The metal slug facilitates the transfer of heat away from the semiconductor because the metal slug has a low thermal resistance, typically about 5 to 10 degrees C/Watt. In conventional designs, unlike the design of FIG. 12 which will be described in further detail below, the metal slug is connected to a metal pad on the PCB either directly with solder or with another good thermal conductor. However, in many cases, conventionally connecting the metal slug to the PCB does not adequately remove the heat from the LED since the PCB is generally a poor thermal conductor.

Continuing with the description of the design of FIG. 12, a heat removing arrangement 1006 is shown for removing the heat from the high power LED. Accordingly, high power LED 1000 is connected to PCB 1002 to receive power for operating. Arrangement 1006 has a number of plated through hole vias 1008. Plated thru hole vias are traditionally used to electrically connect different levels of a circuit within a PCB or to insert a leaded component that is later used for soldering to a circuit component.

Through hole vias 1008 are used for conducting heat away from high power LED 1000 to help to keep high power LED 1000 below a temperature at which the LED would be damaged from the heat. Vias 1008 extend through the PCB from metal slug 1004 to a heat sink 1010. The vias are thermally connected to the metal slug and heat sink to thermally communicate heat from the metal slug through the vias and the heat sink to the ambient environment. These thermal connections can be through contact alone, or the connections may include a thermally conductive substance or physical attachment.

Vias 1008 can be filled with a highly thermally conductive material such as copper 1012, solder or other thermal compound. Vias 1008 can also be connected to one or more layers of copper sheet 1014 that are part of the fiberglass PCB, in addition to being connected to the heat sink 1010. In these instances, the copper sheet serves to facilitate heat transfer and dissipation.

Vias 1008 can be positioned in a high density arrangement by spacing the vias 0.050 inches or less on center. The high density is used to create a high density of metal under and surrounding the metal slug. A high density of vias facilitates heat transfer to a greater extent than lower densities.

Heat sink 1010 can be an aluminum sheet or other structure or material for transferring heat to the atmosphere. Heat sink 1010 may have a shape with a large surface area to facilitate the heat transfer. Heat sink 1010 is connected to vias 1008 in a manner which promotes heat transfer from the vias to the heat sink Arrow 1009 illustrates a path of heat transfer. Heat sink 1010 may be shaped to create recesses so that electronic parts can be accommodated on both sides of the PCB. These recesses would be arranged at locations away from the LED where the electronic parts are located.

The temperature dependent resistance used in the temperature dependent feedback circuit, such as those described above, can be mounted in the thermal pathway of the heat from the high power LED, for example, by mounting the temperature dependent resistance in thermal contact with copper sheet 1014 or heat sink 1010. In this way, the temperature dependent resistance can determine a temperature that is related to the temperature of the high power LED for control purposes, such as those described above.

Figure 13:
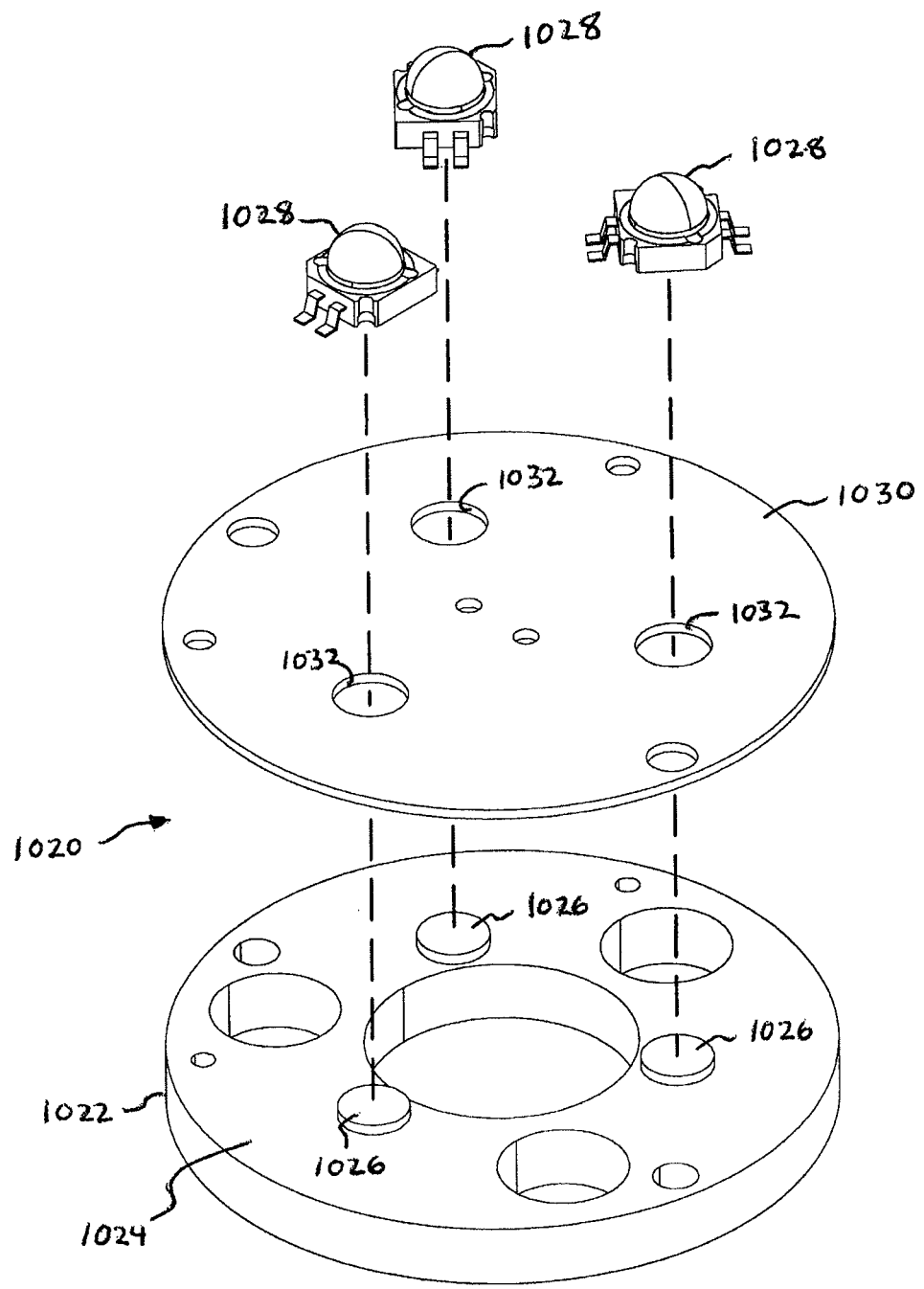
FIG. 13 illustrates another embodiment of a heat conducting apparatus for removing heat from the LEDs.

Another embodiment, shown in FIG. 13, involves a heat removing arrangement 1020 with a heat sink 1022 that has a main body 1024 and raised portions 1026. High power LEDs 1028 are mounted and electrically connected to a PCB 1030. The LEDs are positioned over holes 1032 defined in the PCB. Heat sink 1022 is positioned on the opposite side of PCB 1030 from LEDs 1028 and raised portions 1026 extend through holes 1028 to contact metal slugs (not shown) in the LEDs. A thermally conducting material (thermal compound) is used to enhance thermal contact between the LEDs and the heat sink.

In heat removing arrangement 1020, heat is conducted away from the LEDs through the metal slugs, through the raised portion of the heat sink, to the main body of the heat sink. The main body of the heat sink dissipates the heat to the ambient environment or surroundings. In the example shown in FIG. 13, three high wattage (greater than 3 Watts each) LEDs producing a total of 600 lumens are placed in close proximity and are operable at safe temperatures.

In one instance, raised portions 1026 have a height above main body 1024 that is substantially the same as a thickness of PCB 1030. In this case, when the raised portions extend through holes 1032, the main body of the heat sink directly contacts the PCB. Heat is removed directly without having to pass through the PCB.

Figure 14:
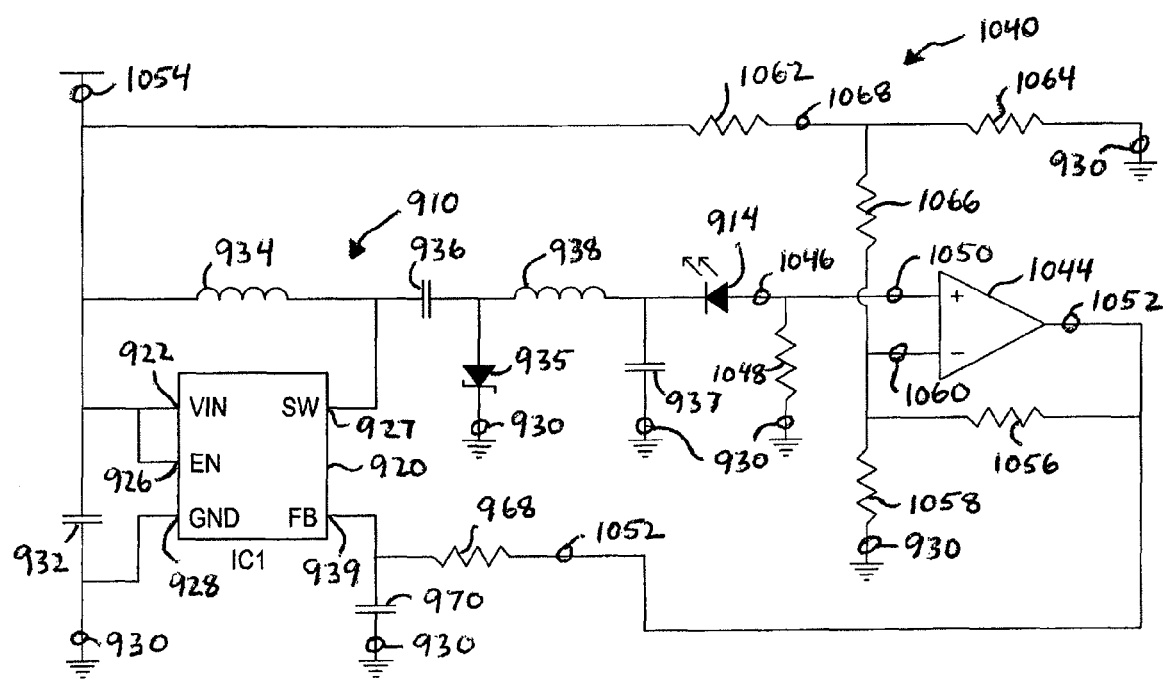
FIG. 14 an embodiment of a regulator circuit having a dimming function.

A dimmer apparatus 1040, shown in FIG. 14, is used for providing a dimming functionality to one or more LEDs 1042. Dimmer apparatus 1040 can also be connected to a current controller as described above and will therefore be discussed in conjunction with current controller 910 using the same component numbers one shown in FIGS. 10 and 11.

Dimming apparatus 1040 allows LED and cold cathode fluorescent lamps (CFL) to be dimmed in a manner similar to incandescent lighting without the need for expensive and complex circuit components. Dimming apparatus 1040 uses a feedback signal 1052 as a function of a source voltage 1054 to affect a dimming function that is controlled by a conventional dimming switch (not shown) through which the source voltage 924 is supplied.

In the present example, LED 914 is connected between capacitor 937 and the non-inverting input of op amp 1044. A LED current 1046 flows through the LED and a sense resistor 1048 to cause the LED to emit light. The LED current flowing through the sense resistor creates an input voltage 1050 at the non-inverting input of op amp 1044. A gain resistor 1056 is connected between the output and the inverting input of op amp 1044 and a drain resistor 1058 is connected between the inverting input and ground 930. Resistors 1056 and 1058 contribute to a voltage 1060 at the inverting input of op amp 1044 and are used for setting the gain of the op amp.

Dimming apparatus 1040 uses resistors 1062 and 1064 arranged in a voltage divider configuration to derive a voltage that is proportional to source voltage 1054 to add to the inverting input of op amp 1044 to create voltage 1060. Resistor 1062 is connected to source voltage 1054 and to resistor 1064 which is connected to ground 930. Resistor 1062 and 1064 divide source voltage 1054 to create proportional voltage 1068 that is proportional to source voltage 1054. An optional resistor 1066 is connected between resistors 1062 and 1064 and the inverting input of op amp 1044. Optional resistor 1066 may be added to separate the function of dividing source voltage 1054 from the relative effect that it has on the op amp bias.

The connection of proportional voltage 1068 via resistor 1066 to the inverting input of op amp 1044 causes feedback signal 1052 to be dependent on the level of source voltage 1054. Proportional voltage 1068 is reduced when source voltage 1054 is reduced by the conventional dimmer switch since voltage 1068 is proportional to source voltage 1054. The voltage of feedback signal 1052 increases when input voltage 1060 decreases due to a decrease in proportional voltage 1068. Increases in the voltage of feedback signal 1052 cause an increased voltage at feedback pin 939 which causes regulator 910 to decrease LED current 1046 thereby reducing the brightness level of LED 914. In this manner, decreased line voltage from a conventional dimmer switch causes a decrease in the brightness or lumen output of LED 914.

Dimmer apparatus 1040 does not require the use of a microprocessor and can be implemented on regulator circuits that lack a brightness control (or enable) function. Other variations of amplifier circuits can be used to achieve the required voltage or current summing to achieve the dimming function using analog components. The dimmer apparatus can be used in conjunction with the thermal management modifications discussed above.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method of thermal management of an illumination device comprising a light-emitting diode (LED), the method comprising:
   (a) generating a regulated current from a source voltage;
   (b) supplying the regulated current to the LED;
   (c) generating a sense voltage based on (i) the regulated current and (ii) an LED temperature resulting from heat produced by the LED; and
   (d) modifying the regulated current supplied to the LED based on the sense voltage, whereby the LED temperature is maintained within a non-destructive range of LED temperatures.

2. The method of claim 1, further comprising repeating steps (b)-(d) at least once.

3. The method of claim 1, wherein generating the sense voltage comprises amplifying at least a portion of the regulated current, an amplitude of the amplification being based on the LED temperature resulting from heat produced by the LED.

4. The method of claim 1, wherein the LED is disposed on a printed circuit board.

5. The method of claim 1, further comprising transferring heat away from the LED by at least one of a heat sink or a via in thermal communication with the LED.

6. The method of claim 1, further comprising dimming the LED.

7. The method of claim 1, wherein generating the sense voltage comprises flowing at least a portion of the regulated current through a temperature-dependent resistance.

8. The method of claim 7, wherein the temperature-dependent resistance has a positive temperature coefficient.

9. The method of claim 7, wherein the temperature-dependent resistance has a negative temperature coefficient.

10. The method of claim 7, wherein the temperature-dependent resistance comprises a thermistor.

11. The method of claim 7, wherein the temperature-dependent resistance is disposed in contact with the LED.

12. The method of claim 7, wherein the temperature-dependent resistance is spaced away from the LED by a thermal pathway comprising air.

13. The method of claim 7, wherein the temperature-dependent resistance is spaced away from the LED by a thermal pathway comprising a non-air fluid medium.

14. The method of claim 7, wherein generating the sense voltage comprises flowing a second portion of the regulated current through a resistor connected in parallel to the temperature-dependent resistance.

15. The method of claim 7, wherein generating the sense voltage comprises flowing a portion of the regulated current through a resistor.

16. The method of claim 7, wherein the temperature-dependent resistance is (i) disposed on a printed circuit board and (ii) proximate the LED.

17. The method of claim 7, wherein the LED is disposed on the printed circuit board.

18. A thermal-management system for an illumination device comprising a light-emitting diode (LED), the system comprising:
   means for generating a regulated current from a source voltage;
   means for supplying the regulated current to the LED;
   means for generating a sense voltage based on (i) the regulated current and (ii) an LED temperature resulting from heat produced by the LED; and
   means for modifying the regulated current supplied to the LED based on the sense voltage, whereby the LED temperature is maintained within a non-destructive range of LED temperatures.

19. The system of claim 18, further comprising means for amplifying at least a portion of the regulated current.

20. The system of claim 19, wherein a gain of the amplifying means depends at least in part on the LED temperature resulting from heat produced by the LED.

21. The system of claim 18, further comprising a printed circuit board on which the LED is disposed.

22. The system of claim 18, further comprising means for dimming the LED.

23. The system of claim 18, further comprising means for transferring heat away from the LED.

24. The system of claim 23, wherein the means for transferring heat away from the LED comprises at least one of a heat sink or a via in thermal communication with the LED.

* * * * *